(12) United States Patent
Erhart et al.

(10) Patent No.: US 12,027,674 B2
(45) Date of Patent: Jul. 2, 2024

(54) BATTERY SYSTEM WITH A FLEXIBLE PRINTED CIRCUIT

(71) Applicant: Samsung SDI Co., Ltd., Yongin-si (KR)

(72) Inventors: Michael Erhart, Seiersberg-Pirka (AT); Wolfgang Reinprecht, Attendorf (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 205 days.

(21) Appl. No.: 17/214,447

(22) Filed: Mar. 26, 2021

(65) Prior Publication Data

US 2021/0305634 A1   Sep. 30, 2021

(30) Foreign Application Priority Data

Mar. 31, 2020   (EP) ..................... 20167146
Mar. 25, 2021   (KR) ............. 10-2021-0038760

(51) Int. Cl.
*H01M 10/42* (2006.01)
*B60L 58/12* (2019.01)
(Continued)

(52) U.S. Cl.
CPC .......... *H01M 10/425* (2013.01); *B60L 58/12* (2019.02); *B60L 58/18* (2019.02); *H01M 10/482* (2013.01);
(Continued)

(58) Field of Classification Search
CPC .......... B60L 58/12; B60L 58/18; B60L 58/21; B60L 58/64; B60L 2240/545;
(Continued)

(56) References Cited

U.S. PATENT DOCUMENTS 10,617,009 B1 *   4/2020   Noonan ............... H05K 3/4038
2007/0202364 A1 *   8/2007   Uh ..................... H01M 50/166
429/174

(Continued)

FOREIGN PATENT DOCUMENTS

DE   10 2011 016 373 A1   10/2012
WO   WO 2010/074290 A1   7/2010
WO   WO 2012/011237 A1   1/2012

OTHER PUBLICATIONS

Intel Ball Grid Array (BGA) Packaging (Year: 2000).*
Usami WO2010074290A1 (cited in IDS filed Mar. 26, 2021) using machine English translation from https://worldwide.espacenet.com/ date: Nov. 16, 2022 (Year: 2010).*

(Continued)

*Primary Examiner* — Matthew T Martin
*Assistant Examiner* — Jared Hansen
(74) *Attorney, Agent, or Firm* — Lewis Roca Rothgerber Christie LLP

(57) ABSTRACT

A battery system includes: a plurality of battery units, each of the battery units including at least one battery cell, the at least one battery cell including a positive terminal, a negative terminal, and a cell case; and a flexible printed circuit (FPC) including a plurality of integrated circuits (ICs) configured for voltage measurement and temperature measurement. The ICs are interconnected by a wiring structure of the FPC. Each of the ICs is thermally connected to the cell case of the at least one of battery cell of each of the battery units via a contact element in the FPC and is electrically connected via the contact element to the positive terminal of the at least one battery cell of each of the battery units.

13 Claims, 5 Drawing Sheets

(51) Int. Cl.
*B60L 58/18* (2019.01)
*H01M 10/48* (2006.01)
*H05K 1/02* (2006.01)
*H05K 1/18* (2006.01)

(52) U.S. Cl.
CPC .......... *H01M 10/486* (2013.01); *H05K 1/028* (2013.01); *H05K 1/181* (2013.01); *H01M 2010/4271* (2013.01); *H01M 2220/20* (2013.01); *H05K 2201/10151* (2013.01)

(58) Field of Classification Search
CPC .. B60L 2240/547; H05K 1/028; H05K 1/181; H05K 1/189; H05K 2201/10151; H01M 10/425; H01M 10/482; H01M 10/486; H01M 50/569; H01M 2010/4271; H01M 2220/20; Y02E 60/10; Y02T 10/70
See application file for complete search history.

(56) References Cited

U.S. PATENT DOCUMENTS

| | | | |
|---|---|---|---|
| 2011/0151297 A1* | 6/2011 | Shimizu | H01M 10/6553 429/94 |
| 2015/0313003 A1* | 10/2015 | Kasar | H01Q 1/243 174/541 |
| 2020/0091477 A1* | 3/2020 | Elfering | H02J 7/342 |

OTHER PUBLICATIONS

MADPCB, "Common Flex PCB Surface Finishes", accessed from https://madpcb.com/common-flex-pcb-surface-finishes/ Date: Oct. 16, 2023, Published Jun. 16, 2018 (Year: 2018).*
Extended European Search Report issued in corresponding EP Application No. 20167146.8, dated Oct. 1, 2020, 6 pages.

* cited by examiner

BATTERY SYSTEM WITH A FLEXIBLE PRINTED CIRCUIT

CROSS-REFERENCE TO RELATED APPLICATION

This application claims priority to and the benefit of European Patent Application No. 20167146.8, filed in the European Patent Office on Mar. 31, 2020, and Korean Patent Application No. 10-2021-0038760, filed in the Korean Intellectual Property Office on Mar. 25, 2021, the entire content of all of which are incorporated herein by reference.

BACKGROUND

1. Field

Aspects of embodiments of the present disclosure relate to a battery system with a flexible printed circuit.

2. Description of Related Art

Recently, vehicles (e.g., vehicles for transportation of goods and people) have been developed that use electric power as a source for motion. Such an electric vehicle is an automobile that is propelled by an electric motor using energy stored in rechargeable (or secondary) batteries. An electric vehicle may be solely powered by batteries or may be a hybrid vehicle powered by, for example, a gasoline generator (e.g., the vehicle may include a combination of electric motor and a conventional combustion engine). Generally, an electric-vehicle battery (EVB) (or traction battery) is a battery used to power the propulsion of a battery electric vehicle (BEV). Electric-vehicle batteries differ from starting, lighting, and ignition batteries in that they are designed to provide (or output) power over sustained periods of time. A rechargeable (or secondary) battery differs from a primary battery in that it is designed to be repeatedly charged and discharged, while the latter provides an irreversible conversion of chemical to electrical energy. Low-capacity rechargeable batteries may be used as a power supply for small electronic devices, such as cellular phones, notebook computers, and camcorders, while high-capacity rechargeable batteries may be used as a power supply for hybrid vehicles and the like.

Generally, rechargeable batteries include an electrode assembly including a positive electrode, a negative electrode, and a separator interposed between the positive and negative electrodes, a case receiving (or accommodating) the electrode assembly, and an electrode terminal electrically connected to the electrode assembly. An electrolyte solution is injected into the case to enable charging and discharging of the battery via an electrochemical reaction between the positive electrode, the negative electrode, and the electrolyte solution. The shape of the case, such as a cylindrical or rectangular shape, may be varied based on the battery's intended purpose. Lithium-ion (and similar lithium polymer) batteries, widely known via their use in laptops and consumer electronics, are the most common type of battery powering the most recent electric vehicles in development.

Rechargeable batteries may be used as (e.g., may be a part of) a battery module including (or formed of) a plurality of unit battery cells coupled to each other in series and/or in parallel to provide high energy density, such as for motor driving of a hybrid vehicle. For example, the battery module may be formed by interconnecting the electrode terminals of the plurality of unit battery cells to each other, the number of unit battery cells depending on a desired amount of power, to realize a high-power rechargeable battery.

The battery modules (or the battery cells) may be configured (or connected to each other) in a series, parallel, or a mixture of both to deliver the desired voltage, capacity, or power density. Components of battery packs include the individual battery modules and the interconnectors, which provide electrical conductivity between them.

The mechanical integration of such a battery system generally includes suitable mechanical connections between the individual components, for example, in and between the battery modules, and a supporting structure of a vehicle. These connections must remain functional and safe throughout the average service life of the battery system. Further, installation space and interchangeability desires should be considered, especially in mobile applications.

Battery modules may be mechanically integrated by providing a carrier framework and by positioning the battery modules thereon. Fixing the battery cells or battery modules may be achieved by fitted depressions in the framework or by mechanical interconnectors, such as bolts or screws. In some cases, the battery modules may be confined by fastening side plates to lateral sides of the carrier framework. Further, cover plates may be fixed atop and below the battery modules.

Thermal control of the battery system may be provided by a thermal management system to safely use the at least one battery module by efficiently emitting, discharging, and/or dissipating heat generated from its rechargeable batteries. If the heat emission/discharge/dissipation is insufficiently performed, temperature deviations may occur between battery cells, such that the at least one battery module may no longer generate a desired amount of power. In addition, an increase in the internal temperature may lead to abnormal reactions occurring therein, and thus, charging and discharging performance of the rechargeable battery deteriorates and the life-span of the rechargeable battery is shortened. Thus, cell cooling by effectively emitting/discharging/dissipating heat from the cells is desired.

Accordingly, measuring cell temperatures and voltages is important to keep a check on the status of the battery system, as safety related issues can occur. Integrated circuits (ICs) are used to measure cell voltages and are designed to handle (e.g., to measure), for example, 6 to 12 battery cells with one chip on the respective IC. Technologies involving one chip per battery cell (also referred to as "one chip for one cell") are being used because such chips have advantages in terms of modularity, cell temperature measurement, and accuracy. Furthermore, the one chip for one cell technology allows for additional measurement functionalities and the use of cheaper chip processes. However, the chips of the respective ICs may be soldered on a printed circuit board (PCB) and connected to the corresponding battery cells of the battery system. Furthermore, communication lines need to be routed through the PCB with additional wiring harnesses, which significantly increases the overall costs. Moreover, the aforementioned technologies used packaged parts and a soldering process, which lead to a higher overall cost.

SUMMARY

Embodiments of the present disclosure seek to solve at least one of the problems existing in the prior art to at least some extent. For example, embodiments of the present disclosure overcome or mitigate at least some of the drawbacks of the prior art and provide a battery system that provides voltage and temperature measurement in an efficient and cost effective manner.

According to one embodiment of the present disclosure, a battery system for battery electric vehicles is provided. The battery system includes a plurality of battery units, each battery unit includes one or more battery cells, and each battery cell includes a positive terminal, a negative terminal, and a cell case. The battery system further includes a flexible printed circuit (FPC) including a plurality of integrated circuits (ICs) configured for voltage measurement and temperature measurement. The ICs are interconnected by a wiring structure of the FPC, and each IC is thermally connected to a cell case of one of the battery cells of each battery unit via a contact element that is in (or on) the FPC, and the IC is further electrically connected via the contact element to the respective positive terminal of the one battery cell.

The IC may include a die having a plurality of interface bumps on a side of the die facing the FPC, and the die may be connected to the FPC via the interface bumps.

The die may be integrated to the FPC by a connecting material between the chip-die and the FPC.

A number of ICs of the FPC may correspond to a number of battery units such that one IC corresponds to one battery unit.

The contact element may include a welded contact between the FPC and the cell case of the one battery cell of the corresponding battery unit.

A case cover of the cell case of the one battery cell of the corresponding battery unit may be electrically connected to the positive terminal of the one battery cell and may be electrically isolated from the negative terminal of the one battery cell.

The negative terminal of the one battery cell may be electrically connected to a positive terminal of the one battery cell of an adjacent battery unit via a busbar.

The IC may be configured to detect a voltage drop caused by a resistance of the busbar.

Communication between the ICs may be in a daisy-chain configuration.

A positive terminal of the IC may be connected to the cell case of the one battery cell of the corresponding battery unit, and negative terminal of the IC may be electrically connected the cell case of the one battery cell of a neighboring battery unit. The neighboring battery unit may have a lower voltage than that of the corresponding battery unit.

Each IC may include a plurality of first bidirectional communication ports connected to the one battery cell of a first neighboring battery unit and a plurality of second bidirectional communication ports connected to the one battery cell of a second neighboring battery unit.

The FPC may be a tape and reel FPC in which a pitch of the ICs corresponds to a width of the battery cells.

The battery system may further include a battery management system (BMS), and at least one end of the FPC may be electrically connected to the BMS.

According to another embodiment of the present disclosure, a flexible printed circuit (FPC) for the battery system as described above is provided. The FPC includes a plurality of integrated circuits (ICs) configured for voltage measurement and temperature measurement, and the ICs are interconnected by a wiring structure of the FPC.

According to another embodiment of the present disclosure, a battery electric vehicle including a battery system as described above is provided.

Further aspects and features of the present disclosure will be learned from the dependent claims and the following description.

BRIEF DESCRIPTION OF THE DRAWINGS

Aspects and features of the present disclosure will become apparent to those of ordinary skill in the art by describing, in detail, exemplary embodiments thereof with reference to the attached drawings in which.

DETAILED DESCRIPTION

Figure 1:
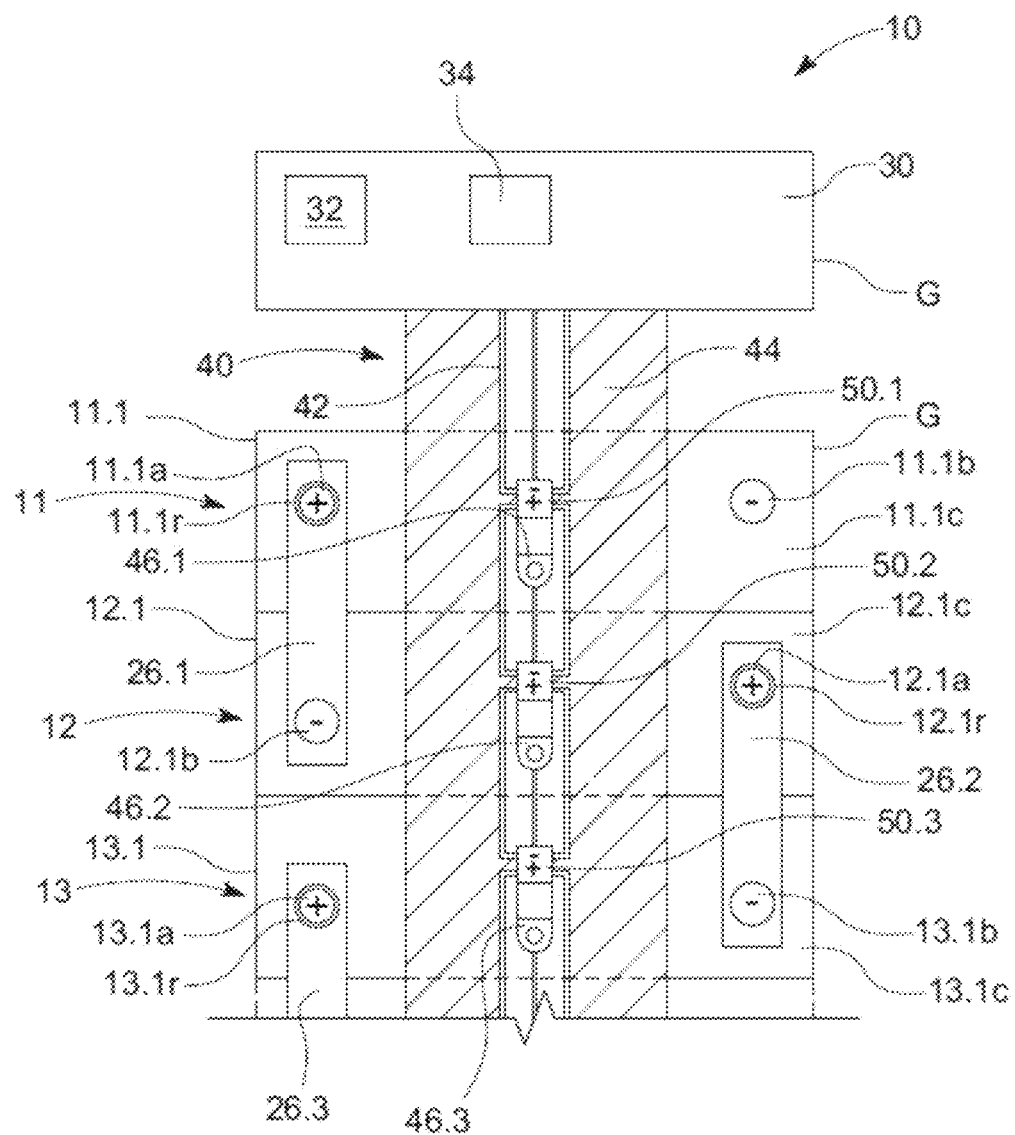
FIG. 1 illustrates a top view of a portion of a battery system according to an embodiment including serial-connected battery units and a flexible printed circuit (FPC) including integrated circuits (ICs) configured to measure voltage and temperature of single battery units.

Aspects and features of the present disclosure and methods of accomplishing the same may be understood more readily by reference to the following detailed description of embodiments and the accompanying drawings. Unless otherwise noted, like reference numerals denote like elements throughout the attached drawings, and thus, descriptions thereof may not be repeated. In the drawings, the relative sizes of elements, layers, and regions may be exaggerated for clarity. As used herein, the term "and/or" includes any and all combinations of one or more of the associated listed items.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized,"

respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

FIG. 1 illustrates a top view of a portion of a battery system 10 according to an embodiment of the present disclosure. The battery system 10 includes a plurality of battery units (e.g., a first battery unit 11, a second battery unit 12, and a third battery unit 13(. According to the embodiment illustrated in FIG. 1, each of the battery units 11, 12, and 13 includes (or is) one single battery cell 11.1, 12.1, and 13.1, respectively.

Each of the plurality of battery cells 11.1, 12.1, and 13.1 includes an electrode assembly including a positive electrode, a negative electrode, and a separator interposed between the positive and negative electrodes, a case receiving (or accommodating) the electrode assembly, and electrode terminals electrically connected to the electrode assembly. For example, each of the plurality of battery cells 11.1, 12.1, and 13.1 includes a respective positive terminal 11.1a, 12.1a, 13.1a and a respective negative terminal 11.1b, 12.1b, 13.1b. That is, the first battery cell 11.1 includes the first positive terminal 11.1a and the first negative terminal 11.1b. The second battery cell 12.1 includes the second positive terminal 12.1a and the second negative terminal 12.1b. The third battery cell 13.1 includes the third positive terminal 13.1a and the third negative terminal 13.1b.

According to the exemplary embodiment illustrated in FIG. 1, the battery cells 11.1, 12.1, and 13.1 are connected to each other in series (e.g., are serially-connected) via busbars 26.1, 26.2, and 26.3.

The cell cases of the battery cells 11.1, 12.1, 13.1 include (or are composed of) a case body and a case cover 11.1c, 12.1c and 13.1c, respectively. The electrode assemblies of the battery cells 11.1, 12.1, 13.1 may be jelly roll-type electrode assembly, formed by spirally winding a positive electrode, connected to the positive terminal 11.1a, 12.1a, and 13.1a, and a negative electrode, connected to the negative terminal 11.1b, 12.1b, and 13.1b, with a separator therebetween. The electrolyte may include a lithium salt, such as $LiPF_6$ or $LiBF_4$, and/or an organic solvent, such as EC, PC, DEC, EMC, or EMC. The electrolyte solution may be in a liquid, solid, or gel state. The case cover 11.1c, 12.1c and 13.1c hermetically seals an opening in the case body.

The battery cells 11.1, 12.1, 13.1 are described as a non-limiting example of a lithium secondary battery having a prismatic (or rectangular) shape. The case body may have a substantially cuboidal shape, and an opening may be formed at one side thereof, which is later closed (e.g., sealed) by the case cover 11.1c, 12.1c, 13.1c. The case body as well as the case cover 11.1c, 12.1c, 13.1c may include (or may be formed of) a metal, such as aluminum.

The battery system 10 may include a cooling system using, for example, a cooling liquid. The cooling system is configured to provide the cooling liquid for cooling the respective battery cells 11.1, 12.1, and 13.1. The cooling liquid may absorb heat generated by the battery cells 11.1, 12.1, and 13.1 during the operation of the battery system 10.

Figure 2:
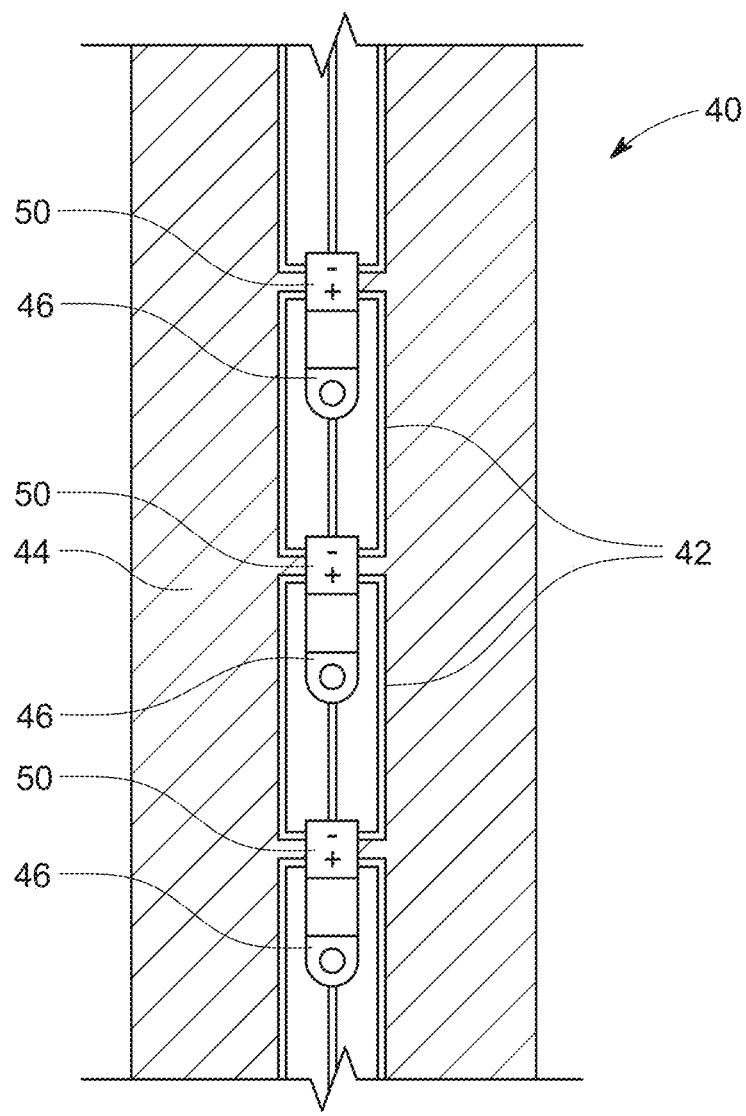
FIG. 2 schematically illustrates a portion of the FPC shown in FIG. 1.

The battery system 10 further includes a flexible printed circuit (FPC) 40. A section of the FPC 40 is shown, in detail, in FIG. 2. The FPC 40 includes metallic traces 42, which may include (or may be made of) copper, bonded to a dielectric layer 44, such as polyimide. Because copper tends to readily oxidize, the exposed surfaces thereof are often covered with a protective layer, with gold and solder being two of the most common materials because of their conductivity and environmental durability. For non-contact areas thereof, a dielectric material protects the metallic traces 42 from oxidation or electrical shorting. The FPC 40 may be a single-sided circuit. Single-sided circuits include (or consist of) a single layer of metal traces 42 on one side of the dielectric layer 44. The metal traces 42 of the FPC 40 form a wiring structure specific to a consumer's desired design. FIG. 2 illustrates metal traces 42 of the wiring structure, which allow for the measurement of temperature and voltage of the battery units 11, 12, 13. The wiring structure may, however, include further metallic traces providing additional functions.

The FPC 40 further includes a plurality of integrated circuits (ICs) 50 configured for voltage measurement and temperature measurement. The ICs 50 are interconnected by the wiring structure of the FPC 40. Furthermore, the FPC 40 includes a plurality of contact elements 46. The number of contact elements 46 is equal to the number of ICs 50, and the contact elements and the ICs 50 are assembled pairwise and closed to each other. The function of the contact elements 46 is explained in more detail below.

Figure 3:
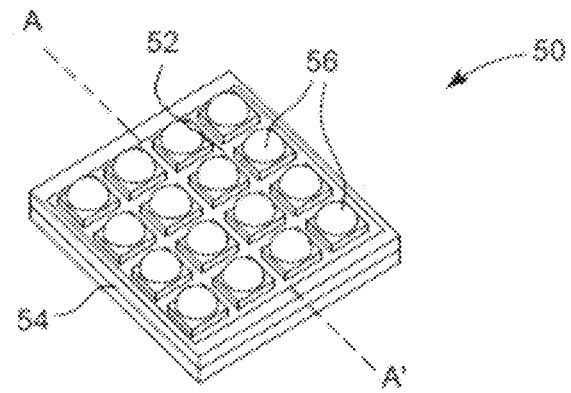
FIG. 3 illustrates a bottom-side perspective view of an IC according to an embodiment.

FIG. 3 depicts a bottom-side perspective view of the IC 50 according to an embodiment, which may be integrated into the FPC 40. Here, the IC 50 includes a die 52 integrated into a die carrier 54. The IC 50 further includes a plurality of interface bumps 56 for establishing electric or thermal connection to the die 52. The interface bumps 56 are provided on a bottom side of the die 52 to face the FPC 40.

The shape, size, and pattern of the interface bumps 56 is not limited to that depicted in embodiment shown in FIG. 3 and may be, for example, a hemi-spherical shape or another suitable shape. The size, number, and pattern of the interface bumps 56 can be identified and chosen by a person skilled in the art based on the specific implementation thereof.

The IC 50 includes a temperature sensor for detecting a temperature. For example, the IC 50 may include a negative temperature coefficient (NTC) thermistor. A thermistor is a thermally sensitive resistor that exhibits a large, predictable, and precise change in resistance correlated to variations in temperature. An NTC thermistor exhibits very high resistance at low temperatures. As its temperature increases, the resistance drops quickly. Because an NTC thermistor experiences such a large change in resistance with respect to temperature, small changes in temperature (e.g., in a range of about 0.05 to about 1.5° C.) are reflected very fast and with high accuracy. Because of its exponential nature, the output of an NTC thermistor uses linearization. The effective operating range of an NTC thermistor is about −50 to about 250° C.

In other embodiments, a semiconductor-based temperature sensor is placed on the IC 50. These sensors are effectively two identical diodes with temperature-sensitive voltage vs current characteristics that can be used to monitor changes in temperature.

Figure 4:
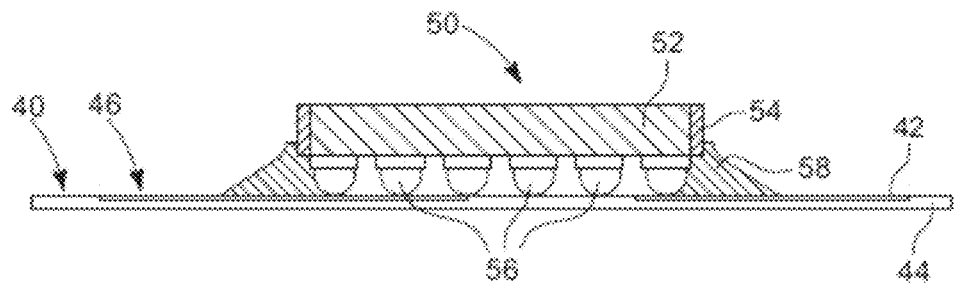
FIG. 4 shows an enlarged side view of the FPC and the IC shown in FIG. 3.

FIG. 4 shows a cross-sectional view on the arrangement of the IC 50 and the FPC 40. The cross-sectional view of FIG. 4 extends through the area of the IC 50 indicated by the axis A-A' shown in FIG. 3. As schematically illustrated, the die 52 is electrically connected directly to the wiring structure of the FPC 40 via the interface bumps 56. Therefore, the IC 50 is placed onto the side of the FPC 40 bearing the wiring structure such that single interface bumps 56 or groups of interface bumps 56 are electrically connected with metal traces 42 of the FPC 40. For example, a number of the interface bumps 56 are electrically connected via the metal trace 42 with an area of the FPC 40 forming the contact element 46.

Furthermore, the IC 50 is bound to the FPC 40 by a connecting material 58. The connecting material 58 may be an adhesive or a metallic filling material that can enable fixation or integration of the IC 50 to the FPC 40. The connecting material 58 reduces mechanical stress imparted to the die 52. Furthermore, the mechanical stress is also reduced due to the flexible structure of the FPC 40. Materials known to a person skilled in the art that may be used as under filling materials may be also used as the connecting material 58.

Referring again to FIG. 1, the number of ICs 50 corresponds to the number of battery units 11, 12, and 13, such that one IC 50.1, 50.2, and 50.3 corresponds to one battery unit 11, 12, and 13. For example, the first IC 50.1 corresponds to the first battery unit 11, the second IC 50.2 corresponds to the second battery unit 12, and the third IC 50.3 corresponds to the third battery unit 13. Thereby, the ICs 50.1, 50.2, and 50.3 provide for the measurement of voltage and temperature of each battery unit 11, 12, and 13 of the battery system 10 with high accuracy.

For example, each IC 50.1, 50.2, and 50.3 is thermally connected to a respective case cover 11.1c, 12.1c, and 13.1c via the contact elements 46.1, 46.2, and 46.3 being disposed on (e.g., being embedded in) the FPC 40. For example, the first IC 50.1 is thermally connected to the first case cover 11.1c via the first contact element 46.1, the second IC 50.2 is thermally connected to the second case cover 12.1c via the second contact element 46.2, and the third IC 50.3 is thermally connected to the third case cover 13.1c via the third contact element 46.3.

Figure 5:
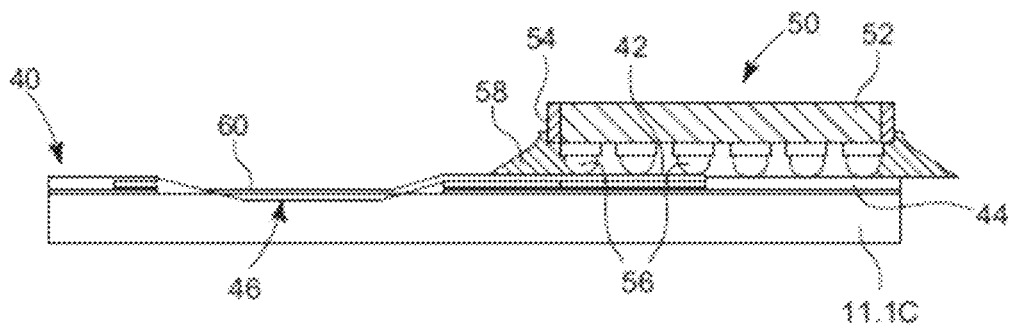
FIG. 5 schematically illustrates the bonding of the FPC shown in FIG. 4 onto the battery unit shown in FIG. 1.

To provide a temperature measurement, the contact element 46.1, 46.2, and 46.3 includes a welded contact 60 between the FPC 40 and the cell case, that is, the case cover 11.1c, 12.1c, and 13.1c of the respective battery cells 11.1, 12.1, and 13.1. As shown in FIG. 1 and, in particular, in FIG. 5, the first contact element 46.1 includes a single welded contact 60, which is shown having a welded shape, at where a metal trace 42 of the FPC 40 is electrically connected to the first case cover 11.1c. For example, a portion of the wiring structure of the FPC 40 corresponding to a region of the single welded contact 60 comes into direct thermal and electrical contact with the first case cover 11.1c. This, in turn, establishes a connection between the first IC 50.1 and the first case cover 11.1c via those interface bumps 56 that contact the portion (or part) of the wiring structure leading to the welded contact 60.

The first IC 50.1 is configured to measure the temperature of the first battery cell 11.1 via the connection between to the wiring structure of the FPC 40 and the first case cover 11.1c. Similarly, the second IC 50.2 and the third IC 50.3 are configured to measure the temperature of the second battery cell 12.1 of the second battery unit 12 and of the third battery cell 13.1 of the third battery unit 13, respectively. The connection of the ICs 50.1, 50.2, and 50.3 with the respective case covers 11.1c, 12.1c, and 13.1c provides a more accurate measurement of the true (or actual) temperature of the respective battery cells 11.1, 12.1, and 13.1. In conventional battery systems, the temperature may be measured at the terminals or busbars interconnecting terminals of neighboring battery cells. However, these elements will heat up when current flows through them due to, for example, internal resistance. For example, the metallic connection of the IC 50 to the wiring structure of the FPC 40 and further via the single welded contact 60 to the respective case covers 11.1c, 12.1c, and 13.1c ensures a more accurate on-chip temperature measurement of the battery cells 11.1, 12.1, and 13.1. Furthermore, a row of cell cases provides a relatively flat surface compared to the protruding terminals 11.1a, 11.1b, 12.1a, 12.1b, 13.1a, and 13.1b or the busbars 26.1, 26.2, and 26.3. Thus, it is easier to dispose the FPC 40 upon the case covers 11.1c, 12.1c, and 13.1c.

A connection of a plurality of battery units 11, 12 and 13 within the battery system 10 can be established by an easy and reliable process because only a single connection, that is, the contact element 46 of the FPC 40 to the related battery cell 11.1, 12.1, 13.1 of the respective battery unit 11, 12 and 13, is necessary. Furthermore, the FPC 40 including the plurality of ICs 50.1, 50.2, and 50.3 may be attached after the battery units 11, 12, and 13 (or modules including the battery units 11, 12, and 13) have been assembled to the battery system 10 (or a battery pack). Thus, the FPC 40 can be attached on a pack level rather than on a module level.

In the manufacturing process of the battery system 10, the FPC 40 is welded to the battery units 11, 12, and 13 at the contact elements 46.1, 46.2, and 46.3 by, for example, a laser welding process. To improve safety and reliability, the contact element 46 may have a double welding connection location. For example, the assembly process of the FPC 40 may provide a pair of welded contacts 60 at each battery unit 11, 12, and 13.

Each IC 50.1, 50.2, and 50.3 is further electrically connected via the contact element 46.1, 46.2, and 46.3 to the respective positive terminal 11.1a, 12.1a, and 13.1a of the corresponding battery cell 11.1, 12.1, and 13.1. According to the embodiment shown in FIG. 1, the case cover 11.1c, 12.1c, and 13.1c of the cell case of the battery cell (e.g., the one battery cell) 11.1, 12.1, and 13.1 is electrically connected to the positive terminal 11.1a, 12.1a, and 13.1a but is electrically isolated from the negative terminal 11.1b, 12.1b, and 13.1b thereof. An electrical connection of the first case cover 11.1c with the first positive terminal 11.1a is depicted by a first ring 11.1r. Similarly, an electrical connection of the second case cover 12.1c with the second positive terminal 12.1a is depicted by a second ring 12.1r, and an electrical connection of the third case cover 13.1c with the third positive terminal 13.1a is depicted by a third ring 13.1r. The electrical connection of the respective case cover 11.1c, 12.1c, and 13.1c with the respective positive terminal 11.1a, 12.1a, and 13.1a may be established mechanically by, for example, a metal junction or connection.

The negative terminal 12.1b of the battery cell 12.1 is electrically connected to the positive terminal 11.1a of the adjacent battery cell 11.1 via the busbar 26.1. Similarly, the negative terminal 13.1b of the battery cell 13.1 is electrically connected to the positive terminal 12.1a of the adjacent battery cell 12.1 via the busbar 26.2, etc. For example, the battery cells 11.1, 12.1, and 13.1, are connected to each other in series. For example, assuming the resistance of the busbar 26.1 to be negligible, the potential of the second negative terminal 12.1b may be the same magnitude as the potential of the first positive terminal 11.1a. Similarly, the third negative terminal 13.1b of the third battery cell 13.1 is electrically connected to the second positive terminal 12.1a of the second battery cell 12.1 by the busbar 26.2. Thus, assuming the resistance of the busbar 26.2 to be negligible, the potential of the third negative terminal 13.1b may be the same magnitude as the potential of the second positive terminal 12.1a. The same explanation can be given in view of the other battery cells in a similar manner.

The power supply terminals of the respective ICs 50.1, 50.2, and 50.3 may be connected to the positive terminals 11.1a, 12.1a, and 13.1a of the respective battery cells 11.1, 12.1, and 13.1 via the respective contact elements 46.1, 46.2, and 46.3. Furthermore, a power supply system of the ICs 50.1, 50.2, and 50.3 may be in a floating state when viewed from the ground potential, denoted by G, which can be the first negative terminal 11.1b of the first battery cell 11.1 or the lowest (or first) battery cell 11.1. The battery system 10 may further include a battery management system (BMS) 30 that regulates (e.g., the regulates the control of) the battery system 10, and at least one end of the FPC 40 is electrically connected to the BMS 30. The BMS 30 may also be at the ground potential G.

For example, considering the first battery unit 11, the contact element 46.1 enables the wire structure of the FPC 40 to contact the first case cover 11.1c of the first battery cell 11.1. The first case cover 11.1c electrically contacts (e.g., is electrically connected to) the first positive terminal 11.1a, and the first positive terminal 11.1a is also electrically connected to the second negative terminal 12.1b of the second battery cell 12.1 of the second battery unit 12 via the busbar 26.1. The first negative terminal 11.1b is at the ground potential G. A positive terminal, denoted by the "+" symbol, of the first IC 50.1 is electrically connected to the first positive terminal 11.1a via the first contact element 46.1. Thus, the first IC 50.1 is able to measure the potential of the first positive terminal 11.1a of the first battery cell 11.1. A negative terminal, denoted by the "−" symbol, of the first IC 50.1 is electrically connected to the BMS 30, which is at the ground potential G, via the wiring structure. Moreover, the negative terminal of the first IC 50.1 is also at the ground potential G. The wire structure of the FPC 40 between the first IC 50.1 and the end of the FPC 40, near which the first IC 50.1 is disposed on the FPC 40, is electrically connected to the BMS 30. Hence, the first IC 50.1 is configured to measure the potential of the first positive terminal 11.1a of the first battery cell 11.1 via the first contact element 46.1.

Furthermore, considering the second battery unit 12, the contact element 46.2 enables the wire structure of the FPC 40 to contact the second case cover 12.1c. The second case cover 12.1c electrically contacts the second positive terminal 12.1a, and the second positive terminal 12.1a is also electrically connected to third negative terminal 13.1b of the third battery cell 13.1 of the third battery unit 13 via the busbar 26.2. A positive terminal, denoted by the "+" symbol, of the second IC 50.2 is electrically connected to the second positive terminal 12.1a via the second contact element 46.2. Hence, the second IC 50.2 is able to measure the potential of the second positive terminal 12.1a of the second battery cell 12.1. A negative terminal, denoted by the "−" symbol, of the second IC 50.2 is electrically connected to the positive terminal of the first IC 50.1. For example, the second negative terminal 12.1b is electrically connected to the first positive terminal 11.1a via the busbar 26.1, and the first positive terminal 11.1a is electrically connected to the positive terminal of the first IC 50.1 via the first contact element 46.1, and the negative terminal of the second IC 50.2 is electrically connected to the positive terminal of the first IC 50.1. Hence, the second IC 50.2 is configured to measure the potential of the second negative terminal 12.1b of the second battery cell 12.1.

Furthermore, a negative terminal, denoted by the "−" symbol, of the third IC 50.3 is electrically connected to the positive terminal of the second IC 50.2, and a positive terminal, denoted by the "+" symbol, of the third IC 50.3 is electrically connected to the third positive terminal 13.1a via the third contact element 46.3. Hence, in manner similar to the second IC 50.2, the third IC 50.3 is configured to measure the potential of the third positive terminal 13.1a and the third negative terminal 13.1b of the third battery cell 13.1, respectively. The same explanation can be given in view of the other battery units in the battery system 10 that are electrically connected by busbars and whose corresponding ICs are electrically connected to each of the neighboring battery units in a similar manner.

Each IC 50.1, 50.2, and 50.3 may include one circuit for measuring the voltage and another circuit for detecting the temperature of the corresponding battery unit 11, 12, and 13. Thus, the ICs 50.1, 50.2, and 50.3 may be configured in such a way that they are not exposed to high voltage operation even in the battery system 10 that measures the high voltage. Further, because signals are exchanged between (e.g., only between) adjacent voltage/temperature detection ICs 50.1, 50.2, and 50.3, the overall wiring becomes is relatively simple.

Each IC 50.1, 50.2, and 50.3 is configured to measure the voltage and temperature of each corresponding battery cells 11.1, 12.1 and 13.1 and to send signals including the information of the measured voltage and temperature to the BMS 30 via the wiring structure. Each IC 50.1, 50.2, and 50.3 is configured to send a data signal to the BMS 30 via the wiring structure, and the data signal may include the positional information of the respective battery cell 11.1, 12.1, and 13.1 of the respective battery unit 11, 12, and 13, an identification number of the one battery cell 11.1, 12.1, and 13.1 of the respective battery unit 11, 12, and 13, voltage and temperature of the one battery cell 11.1, 12.1, and 13.1 of the respective battery unit 11, 12 and 13, along with the time of measurement of the voltage and temperature of the one battery cell 11.1, 12.1, and 13.1 of the respective battery unit 11, 12 and 13. The data signal corresponding to a particular IC 50.1, 50.2, and 50.3 may be stored in a storage unit 32 of the BMS 30, and the data signals of each of the ICs 50.1, 50.2, and 50.3 may be processed by a controller 34 of the BMS 30 to determine the status of each battery unit 11, 12, and 13 of the battery system 10 and that of the battery system 10 as a whole.

Furthermore, the FPC 40 may be a tape and reel FPC with a pitch (e.g., a predetermined or predefined pitch) depending on the width of the battery cells 11.1, 12.1, and 13.1. For example, the breadth of the FPC 40 may lie with a width (e.g., a predefined width) corresponding to the width of the wiring structure and the width corresponding to a distance between the respective terminals of the battery cells 11.1, 12.1, and 13.1.

Furthermore, the IC 50.1, 50.2, and 50.3 is configured to detect a voltage drop caused by a resistance of the busbar 26.1, 26.2, and 26.3. For example, a voltage drop caused due to an internal resistance of the busbars 26.1, 26.2, and 26.3 may be detected by the respective ICs 50.1, 50.2, and 50.3 when the ICs 50.1, 50.2, and 50.3 are configured to measure the current or voltage value between loaded and unloaded conditions. Hence, a difference in the current or voltage may be measured, which provides for measuring the resistance of the respective busbar 26.1, 26.2, and 26.3. Furthermore, the BMS 30 and/or the ICs 50.1, 50.2, and 50.3 may use a correction function to calculate the corrected potential of the negative terminal 11.1$b$, 12.1$b$, and 13.1$b$ from the measured value obtained from the positive terminal 11.1$a$, 12.1$a$, and 13.1$a$ of the corresponding neighboring battery cells 11.1, 12.1, and 13.1 because the negative terminal 11.1$b$, 12.1$b$, and 13.1$b$ of a given battery cell 11.1, 12.1, and 13.1 is electrically connected to the positive terminal 11.1$a$, 12.1$a$, and 13.1$a$ of the corresponding neighboring battery cell 11.1, 12.1, and 13.1 by the busbar 26.1, 26.2, and 26.3.

Communication between the ICs 50.1, 50.2, and 50.3 may be in the form of a daisy-chain communication. The daisy-chain communication (or connection) does not require any additional printed board circuit because communication is provided by a two wire daisy-chain within the FPC 40. The battery units 11, 12, and 13, each including the respective one battery cell 11.1, 12.1, and 13.1, are electrically connected to each other in series, and the corresponding ICs 50.1, 50.2, and 50.3 are arranged along the FPC 40. A positive terminal of one of the ICs 50.1, 50.2, and 50.3 is electrically connected to the cell case of the one battery cell 11.1, 12.1, and 13.1 of the corresponding battery unit 11, 12 and 13, and a negative terminal of said IC 50.1, 50.2, and 50.3 is electrically connected to the cell case of the one battery cell 11.1, 12.1, and 13.1 of the neighboring battery unit 11, 12 and 13 having a lower voltage than that of the corresponding battery unit 11, 12, and 13. Furthermore, each IC 50.1, 50.2, and 50.3 includes a plurality of (e.g., two) first bidirectional communication ports connected to the one battery cell 11.1, 12.1, and 13.1 of a first neighboring battery unit 11, 12, and 13 and a plurality of (e.g., two) second bidirectional communication ports connected to the one battery cell 11.1, 12.1, and 13.1 of a second neighboring battery unit 11, 12, and 13.

A standard or low voltage chip process can be used instead of a high voltage (e.g., voltage greater than about 10 Volts) chip process, which decreases costs on chip level. For example, by a supply voltage of about 5 Volts, a communication from one battery unit 11, 12, and 13 to another battery unit 11, 12, and 13 is done via capacitive isolation; that is, an input and output of the battery units 11, 12, and 13 cannot be more than a magnitude of about 5 Volts (e.g., plus and minus about 5 Volts) with respect to ground potential.

Figure 6:
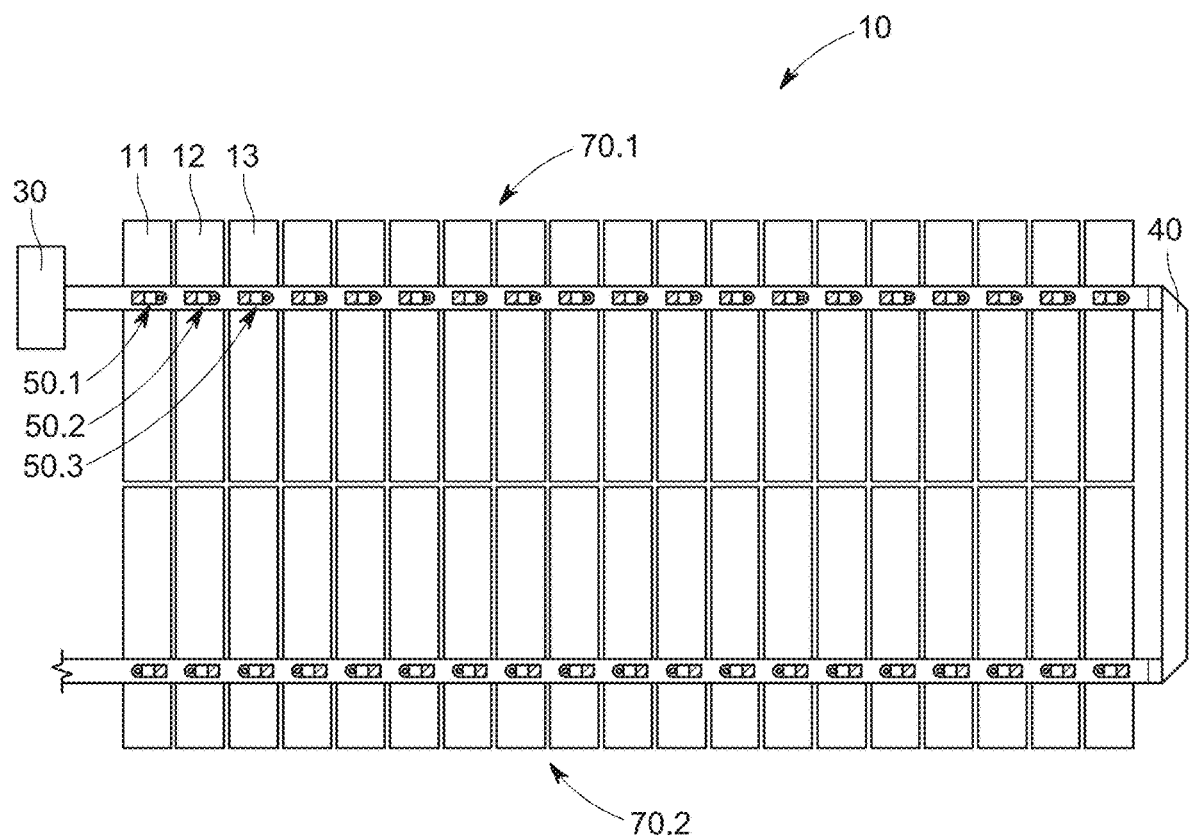
FIG. 6 illustrates a top view of a battery system with a flexible printed circuit according to another embodiment.

For illustration, FIG. 6 shows a top view of a battery system 10 with the above described flexible printed circuit 40 according to another embodiment. The battery system 10 includes a first battery module 70.1 and second battery module 70.2. Each battery module 70.1 and 70.2 includes a plurality of battery units, for example, battery units 11, 12, and 13. The FPC 40 includes a plurality of ICs, for example, ICs 50.1, 50.2, and 50.2, which are connected to the battery units 11, 12, and 13 as described above. The FPC 40 allows for the battery system 10 to be modular, in which the length and the amount of battery units within the battery modules 70.1 and 70.2 can be easily varied. Furthermore, high reliability can be achieved because the FPC 40 production process can be run under clean room conditions. In addition, a rework process is simplified because the FPC 40 may be easily removed and replaced in case of defects or when battery units need to be replaced.

Figure 7:
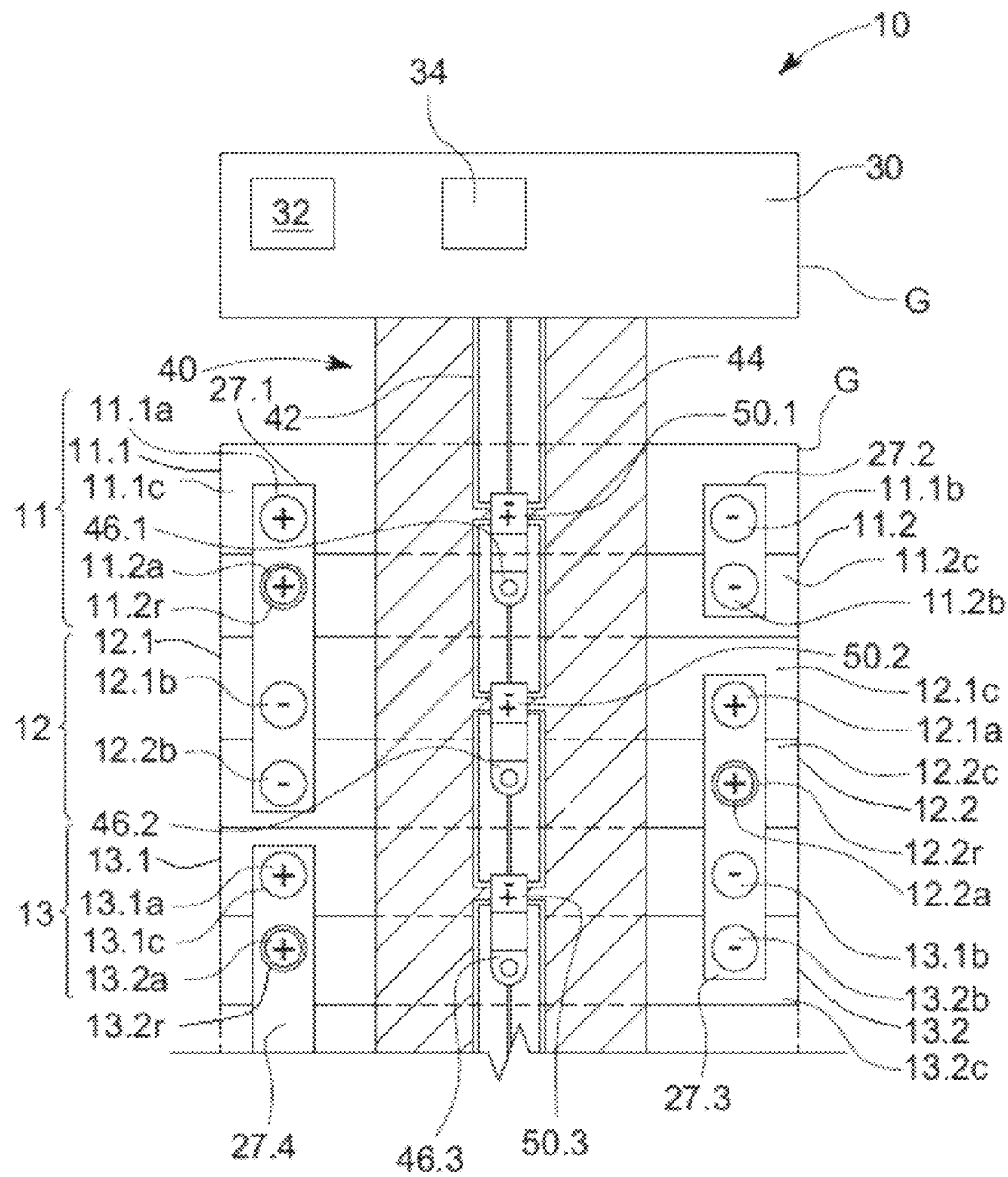
FIG. 7 illustrates a top view of a portion of a battery system according to another embodiment including serial-connected battery units with subunits of parallel-connected battery cells and an FPC configured to measure voltage and temperature of single battery units.

FIG. 7 depicts a top view of a portion of a battery system according to another embodiment. The battery system 10 is a 2P battery system and includes serially-connected battery units including subunits of battery cells connected to each other in parallel. For example, the battery system 10 includes a plurality of battery units 11, 12 and 13, and each battery unit 11, 12 and 13 includes a plurality of (e.g., two) battery cells 11.1, 11.2, 12.1, 12.2, 13.1, and 13.2 respectively. Each of the battery cells 11.1, 11.2, 12.1, 12.2, 13.1, and 13.2 includes a respective positive terminal 11.1$a$, 11.2$a$, 12.1$a$, 12.2$a$, 13.1$a$, and 13.2$a$ and a respective negative terminal 11.1$b$, 11.2$b$, 12.1$b$, 12.2$b$, 13.1$b$, and 13.2$b$.

The first battery unit 11 includes a plurality of (e.g., two) battery cells 11.1 and 11.2, including a first battery cell 11.1 and a second battery cell 11.2, which are electrically connected to each other in a parallel connection configuration by a busbar 27.1 connecting the respective positive terminals 11.1$a$ and 11.2$a$ and a busbar 27.2 connecting the respective negative terminals 11.1$b$ and 11.2$b$ of the respective battery cells 11.1 and 11.2 within the first battery unit 11. The second battery unit 12 includes a plurality of (e.g., two) battery cells 12.1 and 12.2, including a first battery cell 12.1 and a second battery cell 12.2, which are electrically connected to each other in a parallel connection configuration by the busbar 27.1 connecting the respective negative terminals 12.1$b$ and 12.2$b$ and a busbar 27.3 connecting the respective positive terminals 12.1$a$ and 12.2$a$ of the respective battery cells 12.1 and 12.2 within the second battery unit 12. The third battery unit 13 includes a plurality of (e.g., two) battery cells 13.1 and 13.2, including a first battery cell 13.1 and a second battery cell 13.2, which are electrically connected to each other in a parallel connection configuration by a busbar 27.4 connecting the respective positive terminals 13.1$a$ and 13.2$a$ and the busbar 27.3 connecting the respective negative terminals 13.1$b$ and 13.2$b$ of the respective battery cells 13.1 and 13.2 within the battery unit 13. The magnitude of voltages of each of the battery cells 11.1 and 11.2, which are electrically connected to each other in parallel may be similar. Hence, the overall voltage of the first battery unit 11 may be the same or substantially the same as one of the battery cells 11.1 and 11.2. The negative terminal 11.1$b$ of the first battery cell 11.1 is at ground potential G. As the negative the first battery cell 11.1 and the second battery cell 11.2 are parallel-connected to each other, the negative terminal 11.2b may also be at the ground potential G, corresponding to the negative terminal 11.1b. The voltage of the battery unit 11 corresponds to the voltage of one of the battery cells 11.1 and 11.2. Similarly, the voltages of the respective battery units 12 and 13 correspond to that of their respective battery cells 12.1, 12.2 and 13.1, 13.2.

The battery system 10 includes a FPC 40 including a plurality of integrated circuits (ICs) 50.1, 50.2, and 50.3 configured for voltage measurement and temperature measurement, and the ICs 50.1, 50.2, and 50.3 are interconnected by a wiring structure of the FPC 40.

In the 2P battery system 10 of the illustrated embodiment, the number of ICs 50.1, 50.2, and 50.3 corresponds to the number of battery units 11, 12, and 13. Each IC 50.1, 50.2, and 50.3 is thermally connected to one battery cell 11.2, 12.2, and 13.2 from among the respective two battery cells 11.1, 11.2, 12.1, 12.2, 13.1, and 13.2 of said battery unit 11, 12, and 13 via a contact element 46.1, 46.2, and 46.3 being disposed in the FPC 40.

For example, the first IC 50.1 is electrically connected to a case cover 11.2c of the cell case of the battery cell 11.2 of the first battery unit 11 to measure the temperature of the battery cell 11.2. Similarly, the second IC 50.2 is electrically connected to a case cover 12.2c of the cell case of the battery cell 12.2 of the second battery unit 12 to measure the temperature of the battery cell 12.2, and the third IC 50.3 is electrically connected to a case cover 13.2c of the cell case of the battery unit 13.2 of the second battery unit 13 to measure the temperature of the battery cell 13.2.

Furthermore, said IC 50.1, 50.2, 50.3 is further electrically connected via the contact element 46.1, 46.2, and 46.3 to the respective positive terminal 11.2a, 12.2a, and 13.2a of the corresponding battery cell 11.2, 12.2, and 13.2. For example, the case cover 11.2c of the case of the battery cell 11.2 is electrically connected to the positive terminal 11.2a, and is electrically isolated from the negative terminal 11.2b. An electrical connection of the case cover 11.2c with the positive terminal 11.2a is depicted by a ring 11.2r. The electrical connection of the case cover 11.2c with the respective positive terminal 11.2a can be established mechanically by, for example, a metal junction or connection.

Similarly, the case cover 12.2c of the case of the battery cell 12.2 is electrically connected to the positive terminal 12.2a and is electrically isolated from the negative terminal 12.2b. An electrical connection of the case cover 12.2c with the positive terminal 12.2a is depicted by a ring 12.2r. The electrical connection of the case cover 12.2c with the respective positive terminal 12.2a can be established mechanically by, for example, a metal junction or connection. The case cover 13.2c of the case of the battery cell 13.2 is electrically connected to the positive terminal 13.2a and is electrically isolated from the negative terminal 13.2b. An electrical connection of the case with the positive terminal 13.2a is depicted by a ring 13.2r. The electrical connection of the case cover 13.2c with the respective positive terminal 13.2a can be established mechanically by, for example, a metal junction or connection.

The negative terminals 12.1b and 12.2b of the respective battery cells 12.1 and 12.2 of the second battery unit 12 are electrically connected to the positive terminal 11.1a and 11.2a of the adjacent battery cells 11.1 and 11.2 of the first battery unit 11 via the busbar 27.1. Similarly, the negative terminals 13.1b and 13.2b of the respective battery cells 13.1 and 13.2 of the third battery unit 13 are electrically connected to the positive terminal 12.1a and 12.2a of the adjacent battery cells 12.1 and 12.2 of the second battery unit 12 via the busbar 27.3. Thus, the first battery unit 11, including the two battery cells 11.1 and 11.2 which are connected to each other in parallel, the second battery unit 12, including the two battery cells 12.1 and 12.2 which are connected to each other in parallel, the third battery unit 13, including the two battery cells 13.1 and 13.2 which are connected to each other in parallel, to be connected to each other in series via the busbars 27.1 and 27.3. Hence, the battery units 11, 12, and 13 are electrically connected to each other in series.

According to embodiment of the battery system 10 shown in FIG. 7, with respect to the first battery unit 11, the IC 50.1 is thermally and electrically connected to the case cover 11.2c of the battery cell 11.2. No further IC is thermally connected to the cell case of the battery cell 11.1, and the cell case is electrically isolated from the positive terminal 11.2a and the negative terminal 12.2b. For example, one IC 50.1 corresponds to the first battery unit 11, and the IC 50.1 is thermally and electrically connected to the case cover 11.2c of the battery cell 11.2. The IC 50.1 provides for the measurement of the temperature and voltage of the battery cell 11.2. However, because the battery cells 11.1 and 11.2 are electrically connected to each other in parallel, the battery cell 11.2 may have the same or substantially same voltage as that of the battery cell 11.1. Moreover, the voltage of the battery unit 11 corresponds to the voltage of one of the battery cells 11.1 and 11.2. Similarly, the IC 50.2 may be configured to measure the temperature of the battery cell 12.2 and to measure the voltage of the battery cells 12.1 and 12.2, and the IC 50.3 may be configured to measure the temperature of the battery cell 13.2 and to measure the voltage of the battery cells 13.1 and 13.2.

For further understanding of the measurement of temperature of the battery cells 11.2, 12.2, and 13.2 of the battery units 11, 12, and 13 of the 2P battery system 10 and the measurement of voltage of the battery cells 11.1, 11.2, 12.1, 12.2, 13.1, and 13.2 as well as the voltage of the battery units 11, 12, and 13, the aforementioned description in view of FIGS. 1 to 6 is applicable.

The embodiment of the battery system 10 as a 2P battery system may be further extended to be a 4P battery system. In a 4P battery system, each battery unit includes four battery units, and one IC is connected to one of the four battery cells of the respective battery unit. The battery units of the 4P battery system are electrically connected to each other in series. Similarly, the battery system 10 may be extended to a 3P or 5P battery system or a battery system in which each battery unit includes a plurality of (e.g., a predetermined number) of battery units, and the battery units are electrically connected to each other in series.

What is claimed is:

1. A battery system comprising:
a plurality of battery units, each of the battery units comprising at least one battery cell, the at least one battery cell comprising a positive terminal, a negative terminal, and a cell case; and
a flexible printed circuit (FPC) comprising a plurality of integrated circuits (ICs) and metal traces embedded in the FPC, the ICs being configured for voltage measurement and temperature measurement and being interconnected by at least one of the metal traces of the FPC,
wherein another one of the metal traces forms a single contact element on the cell case of the at least one battery cell of a first one of the battery units to thermally and electrically connect a first one of the ICs to the at least one battery cell of the first one of the battery units, wherein the contact element comprises a welded contact between the FPC and the cell case.

2. The battery system according to claim 1, wherein each of the ICs comprises a die having a plurality of interface bumps on a side of the die facing the FPC, and wherein the die is electrically connected to the FPC via the interface bumps.

3. The battery system according to claim 2, wherein the die is integrated with the FPC by a connecting material.

4. The battery system according to claim 1, wherein a number of the ICs of the FPC corresponds to a number of the battery units, and wherein the ICs and the battery units are in one-to-one correspondence.

5. The battery system according to claim 1, wherein the at least one battery cell further comprises a case cover sealing the cell case, and wherein the case cover of the cell case of the at least one battery cell of the first one of the battery units is electrically connected to the positive terminal of the at least one battery cell and is electrically isolated from the negative terminal of the at least one battery cell.

6. The battery system according to claim 1, wherein the negative terminal of the at least one battery cell of the first one of the battery units is electrically connected to the positive terminal of the at least one battery cell of an adjacent one of the battery units via a busbar.

7. The battery system according to claim 6, wherein the ICs are configured to detect a voltage drop caused by a resistance of the corresponding busbar.

8. The battery system according to claim 1, wherein the ICs are configured for daisy-chain communication.

9. The battery system according to claim 1, wherein a positive terminal of the ICs is electrically connected to the cell case of the at least one battery cell of the first one of the battery units, and a negative terminal of the ICs is electrically connected to the cell case of the at least one battery cell of a neighboring one of the battery units having a lower voltage than that of the first one of the battery units.

10. The battery system according to claim 1, wherein each of the ICs comprises a plurality of first bidirectional communication ports connected to the at least one battery cell of a first neighboring battery unit and a plurality of second bidirectional communication ports connected to the at least one battery cell of a second neighboring battery unit.

11. The battery system according to claim 1, wherein the FPC is a tape and reel FPC having a pitch of the ICs corresponding to a width of the battery units.

12. The battery system according to claim 1, further comprising a battery management system (BMS), wherein one end of the FPC is electrically connected to the BMS.

13. A battery electric vehicle comprising the battery system according to claim 1.

* * * * *